United States Patent

Sams et al.

[15] 3,648,073

[45] Mar. 7, 1972

[54] PULSE DRIVER CIRCUIT APPARATUS

[72] Inventors: Gerald R. Sams, Atherton; Robert H. Watson, San Jose, both of Calif.

[73] Assignee: Gerald R. Sams, Atherton, Calif.

[22] Filed: Sept. 17, 1968

[21] Appl. No.: 760,270

[52] U.S. Cl. ............................... 307/246, 307/266, 307/312

[51] Int. Cl. ............................... H03k 17/60

[58] Field of Search ............................... 307/283, 311, 312, 266, 246, 307/315

[56] References Cited

UNITED STATES PATENTS

| | | | |
|---|---|---|---|
| 3,126,489 | 3/1964 | Dill | 307/266 |
| 3,308,308 | 3/1967 | Bray | 307/283 X |
| 3,381,533 | 5/1968 | Behrens | 307/283 X |
| 3,483,529 | 12/1969 | Fenner | 307/312 X |
| 3,246,209 | 4/1966 | Multari et al. | 307/246 X |
| 3,404,291 | 10/1968 | Green et al. | 307/246 X |

*Primary Examiner*—John S. Heyman
*Attorney*—Harvey G. Lowhurst

[57] ABSTRACT

Pulse driver circuit apparatus of the type suited for use as a means to energize GaAs laser diodes and the like wherein a first transistor operated in the avalanche mode is used to rapidly inject a stored quantity of charge into the base of a power transistor which serves as a gate for discharging a second capacitor into the low-impedance laser diode or other output apparatus.

2 Claims, 2 Drawing Figures

INVENTORS
GERALD R. SAMS
ROBERT H. WATSON
BY Harvey G. Lowhurst
ATTORNEY

PULSE DRIVER CIRCUIT APPARATUS

BACKGROUND OF THE INVENTION

The present invention relates generally to pulse-generating apparatus and, more particularly, to driver circuits for providing very high current pulses of short duration suitable for energizing laser diodes or other laser apparatus.

As laser diode development and application has advanced, so has the need for improved pulse type circuitry capable of generating output pulses of substantial current for short periods of time. One prior art method of producing the required high-current pulse has been the use of a resistor-capacitor circuit wherein the capacitor is charged to a predetermined voltage, during the quiescent state of the circuit, after which it is rapidly discharged through an output load upon the application of a trigger pulse to a suitable switching means. By using high-power solid-state switching devices, it is possible to open and close the required circuit connections at very high speeds, thus producing high current pulses of the type necessary to drive the load device.

However, a major factor affecting the characteristics of the output pulses generated by such circuits is the response time of the switch used to initiate the discharge of the capacitor upon application of the input trigger pulse and, since the response time of most transistor switches is dependent upon the rise time of the trigger pulse input thereto, it is necessary that the trigger pulse have an extremely fast rise time. Provision in the prior art of a simple circuit including means for producing a suitable triggering function has heretofore been inadequate.

OBJECTS OF THE INVENTION

It is therefore a principal object of the present invention to provide a novel driver circuit, simple in construction, for generating very high current pulses of short duration for driving a low-impedance load.

Another object of the present invention is to provide a driver circuit which uses an avalanche transistor to drive a high-power, high-frequency transistor which furnishes a very high current, short pulse for energizing a low-impedance load.

Another object of the present invention is to provide a novel driver circuit utilizing an avalanche transistor to switch a high-power transistor for providing a high-current pulse of energy to a laser diode or other injection laser device, and including means for controlling the duration of the high-current pulse by controlling the amount of charge delivered to the base of the high-power transistor.

Still other objects and advantages of the present invention will become apparent from the following detailed description of the preferred embodiments when considered along with the appended drawing.

BRIEF STATEMENT OF THE INVENTION

The present invention relates to a novel transistor circuit and apparatus wherein a first transistor operated in the avalanche mode is used to rapidly inject a stored quantity of charge into the base of a power transistor which serves as a gate for energizing a low-impedance load such as a laser diode or the like.

DESCRIPTION OF THE PREFERRED EMBODIMENT

Figure 1:
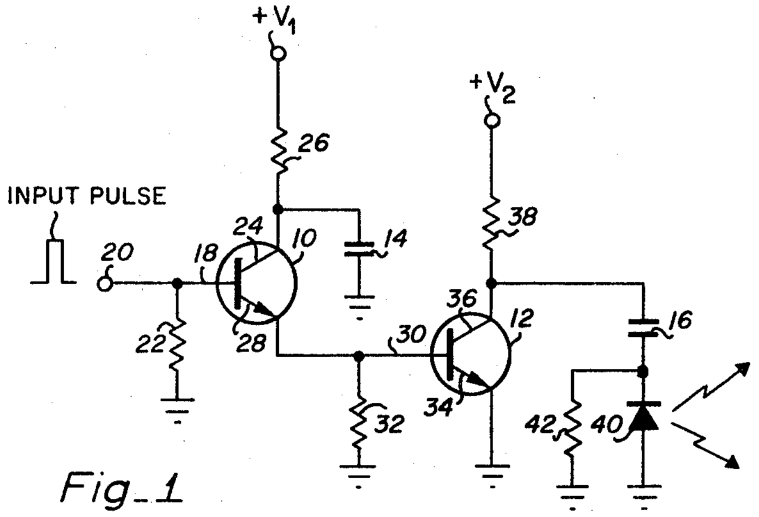
FIG. 1 illustrates a preferred embodiment of a driver circuit in accordance with the present invention.

Referring now to the drawing, there is shown in FIG. 1 a preferred embodiment of a pulse driver circuit in accordance with the present invention. The circuit briefly includes an avalanche transistor 10 directly coupled to a power transistor 12 and a pair of storage capacitors 14 and 16 for providing the charges of current which are gated by the respective transistors.

The NPN transistor 10 may, for example, be a 2N3034 operated in the avalanche mode. The base 18 thereof is connected to a circuit input terminal 20 and an input resistor 22, of perhaps 150 ohms, which provides a base return path for the transistor 10 when the terminal 20 is capacitively coupled to an input pulse providing source. A source of voltage $V_1$, of perhaps 90 volts, is provided for biasing the collector 24 of transistor 10 through a resistance 26 of 6.8K ohms. The resistance 26 also serves as a recharging resistor for regulating the rate of charge of the 3,900-pf. storage capacitor 14 which is coupled to the collector 24 of transistor 10.

The emitter 28 of transistor 10 is directly coupled to the base 30 of the NPN power transistor 12 which may, for example, be a 2N5102. The base 30 is also coupled to ground through a 10-ohm resistor 32 which provides a base return for the transistor 12. The emitter 34 of transistor 12 is grounded.

A 90-volt source of voltage $V_2$ provides a biasing voltage to the collector 36 of transistor 12 through a 2.4K-ohm resistor 38. One side of the 0.01-mfd. storage capacitor 16 is also connected to the collector 36 of transistor 12, and receives its charge from $V_2$ through the recharge resistor 38. The other side of the capacitor 16 is coupled to ground through a chosen low-impedance load 40, such as an RCA TA2628 GaAs laser diode, and a 68-ohm resistance 42 connected in parallel with the load 40 for preventing the recharge current of capacitor 16 from putting excessive reverse voltage on the laser diode.

In operation, with no input initially applied to the input terminal 20, the transistors 10 and 12 are maintained in their quiescent stages, and the storage capacitors 14 and 16 are charged to substantially the voltages of $V_1$ and $V_2$ respectively. Upon the application of a positive going input pulse of greater than 2 volts peak to the input terminal 20, the emitter-base junction of transistor 10 is quickly forward biased causing charge carriers to move toward the collector-base junction of transistor 10. Here, they are influenced by the strong electric field created across the collector-base junction by the voltage source $V_1$, and are accelerated to extremely high velocities while colliding with atoms in the semiconductor material thus producing more charge carriers which are likewise accelerated to extremely high velocities.

As this process multiplies, the transistor is said to avalanche and permit an extremely large collector-to-emitter current flow which rapidly discharges the charge stored in storage capacitor 14, and injects it into the base 30 of power transistor 12. As soon as the discharge current of capacitor 14 drops below the holding current of transistor 10, the avalanching action ceases, transistor 10 turns OFF, and capacitor 14 is recharged through resistor 26.

Since the rate at which a normally operated nonavalanching transistor is turned ON is a function of the rise time of the charge of current injected into the base thereof, it can be seen that the avalanching output of transistor 10 will cause power transistor 12 to be turned ON substantially instantaneously so as to discharge, through the load 40, the charge stored in storage capacitor 16. Since the only impedance offered to the discharge of the capacitor 16 is the load 40, the ON resistance of transistor 12 and the internal lead inductance thereof, which preferably is very low, the pulse of current which is supplied to the load 40 is extremely high in peak value and is of short duration. As an example, the above-described circuit is capable of producing pulses of 30 amperes peak amplitude and 20 nanoseconds duration.

Figure 2:
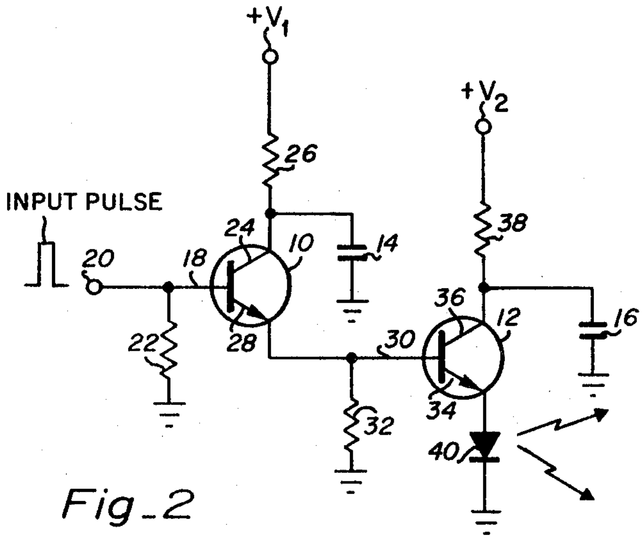
FIG. 2 illustrates an alternative embodiment of a driver circuit in accordance with the present invention.

Turning now to FIG. 2 of the drawing, there is shown an alternative embodiment of the present invention. In this embodiment the load impedance 40 is connected between the emitter 34 of power transistor 12 and ground, and the lower side of the capacitor 16 is connected directly to the circuit ground. This modification is essentially a relocation of the emitter circuit ground of transistor 12 and allows the elimination of the protective resistance 42 shown in FIG. 1. The operation of this modified circuit is substantially identical to that of the FIG. 1 embodiment.

In this case, as in the other embodiment, the amplitude of the pulse applied to the load 40 is determined largely by the voltage to which the storage capacitor 16 is charged, by the ON resistance of the power transistor 12 and by the inductance in the output circuit. The pulse duration is controlled largely by the quantity of charge injected into the base of transistor 12 and by the charge storage time therein.

Although the above-described circuits utilize NPN transistors, PNP transistors could likewise be used by making appropriate circuit alterations to observe correct biasing polarity. The transistor 10 must be capable of being operated in the avalanche mode without self destruction, and must not avalanche at the operating voltage $V_1$, where the circuit is to be externally triggered. On the other hand, if the circuits are to be free running the transistor 10 must be chosen from those which will avalanche below the operating voltage $V_1$. In addition, the power transistor 12 must be capable of very rapid response, and must be able to pass high peak currents with low ON resistance and low internal lead inductance. The RF power transistors have been found the most suited for this purpose.

After having read the above disclosure it will be apparent to those of skill in the art that many alterations and modifications can be made to the pulse driver circuit without departing from the merits of the invention. It is therefore to be understood that this description is for purposes of illustration only and is in no manner intended to be limiting in any way. Accordingly, we intend that the appended claims be interpreted as covering all modifications which fall within the true spirit and scope of our invention.

What is claimed is:

1. Pulse driver circuit means for providing high current pulses of short duration, comprising:

a first transistor having a first base, a first emitter and a first collector, said first transistor being biased to operate in the avalanche mode;

a second transistor having a second base direct connected to said first emitter, a second emitter, and a second collector, first power supply means coupled to said first collector;

second power supply means coupled to said second collector;

load means coupled to said second emitter;

a first capacitive potential storage means coupled to said first collector for discharge through said first transistor into said second base; and a second capacitive potential storage means coupled to said second collector for discharge through said second transistor into said load means, whereby an input pulse applied to said first base causes said first capacitive potential storage means to discharge through said first transistor into said second base thereby causing said second capacitive potential storage means to discharge through said second transistor into said load means.

2. Pulse driver circuit means for providing high current pulses of short duration, comprising:

a first transistor having a first electrode, a second electrode, and a third electrode, said first transistor being biased to operate in the avalanche mode;

a second transistor having a fourth electrode direct connected to said second electrode, a fifth electrode and a sixth electrode;

first power supply means coupled to said third electrode;

second power supply means coupled to said sixth electrode;

a first capacitor coupled to said third electrode;

a second capacitor coupled to said sixth electrode; and an injection laser coupled to said fifth electrode, whereby an input pulse of a predetermined potential applied to said first electrode causes said first transistor to couple charge stored in said first capacitor into said fourth electrode thereby causing said second transistor to couple charge stored in said second capacitor into said injection laser.

* * * * *